United States Patent
Jung et al.

(10) Patent No.: US 11,587,784 B2
(45) Date of Patent: Feb. 21, 2023

(54) SMOOTH TITANIUM NITRIDE LAYERS AND METHODS OF FORMING THE SAME

(71) Applicant: Eugenus, Inc., San Jose, CA (US)

(72) Inventors: Sung-Hoon Jung, Santa Clara, CA (US); Niloy Mukherjee, San Ramon, CA (US); Hee Seok Kim, Seongnam (KR); Kyu Jin Choi, Seongnam (KR); Moonsig Joo, Suwon (KR); Hae Young Kim, San Jose, CA (US); Yoshikazu Okuyama, Santa Cruz, CA (US); Nariman Naghibolashrafi, San Jose, CA (US); Bunsen B. Nie, Fremont, CA (US); Somilkumar J. Rathi, San Jose, CA (US)

(73) Assignee: Eugenus, Inc., San Jose, CA (US)

( * ) Notice: Subject to any disclaimer, the term of this patent is extended or adjusted under 35 U.S.C. 154(b) by 95 days.

(21) Appl. No.: 16/595,952

(22) Filed: Oct. 8, 2019

(65) Prior Publication Data

US 2021/0104397 A1 Apr. 8, 2021

(51) Int. Cl.
| | |
|---|---|
| H01L 21/02 | (2006.01) |
| C23C 16/455 | (2006.01) |
| H01L 21/28 | (2006.01) |
| C23C 16/34 | (2006.01) |

(52) U.S. Cl.
CPC .... *H01L 21/0228* (2013.01); *C23C 16/45527* (2013.01); *H01L 21/0254* (2013.01);
(Continued)

(58) Field of Classification Search
CPC .......... H01L 21/0228; H01L 21/02211; H01L 21/0254; H01L 21/28194; C32C 16/34; C32C 16/45527
See application file for complete search history.

(56) References Cited

U.S. PATENT DOCUMENTS

| | | | | |
|---|---|---|---|---|
| 6,059,872 A | * | 5/2000 | Ngan | ................... C23C 14/0641 |
| | | | | 106/286.8 |
| 6,136,682 A | * | 10/2000 | Hegde | ............... H01L 21/76807 |
| | | | | 204/192.15 |

(Continued)

FOREIGN PATENT DOCUMENTS

KR 10-2018-0123429 A 11/2018

OTHER PUBLICATIONS

International Search Report and Written Opinion dated Dec. 30, 2020 in Application No. PCT/US2020/050628.
(Continued)

*Primary Examiner* — Kelly M Gambetta
(74) *Attorney, Agent, or Firm* — Knobbe Martens Olson & Bear, LLP

(57) ABSTRACT

The disclosed technology generally relates to forming a titanium nitride layer, and more particularly to forming by atomic layer deposition a titanium nitride layer on a seed layer. In one aspect, a semiconductor structure comprises a semiconductor substrate comprising a non-metallic surface. The semiconductor structure additionally comprises a seed layer comprising silicon (Si) and nitrogen (N) conformally coating the non-metallic surface and a TiN layer conformally coating the seed layer. Aspects are also directed to methods of forming the semiconductor structures.

15 Claims, 9 Drawing Sheets

(52) U.S. Cl.
CPC .. *H01L 21/02211* (2013.01); *H01L 21/28194* (2013.01); *C23C 16/34* (2013.01)

(56) References Cited

U.S. PATENT DOCUMENTS

| | | | |
|---|---|---|---|
| 9,159,608 | B2 | 10/2015 | Park et al. |
| 2008/0124926 | A1 | 5/2008 | Chan et al. |
| 2008/0305561 | A1* | 12/2008 | Govindarajan ... C23C 16/45529 438/7 |
| 2013/0102150 | A1* | 4/2013 | Oh .................. H01L 45/147 257/E21.585 |
| 2013/0221445 | A1* | 8/2013 | Lei .................. H01L 21/28008 257/368 |
| 2018/0347040 | A1 | 12/2018 | Vats et al. |
| 2018/0350657 | A1 | 12/2018 | Vats et al. |

OTHER PUBLICATIONS

Knez, Mato "Diffusion phenomena in atomic layer deposition," Semiconductor Science and Technology 27 074001, Jun. 22, 2012, pp. 1-8.

Juppo, Marika "Atomic Layer Deposition of Metal and Transition Metal Nitride Thin Films and In Situ Mass Spectrometry Studies," Helsinki 2001, pp. 1-65.

Muhlbacher, Marlene "High-resolution characterization of TiN diffusion barrier layers," Linköping 2015, pp. 1-76.

Ritala, Mikko "Atomic layer deposition (ALD): from precursors to thin film structures," Thin Solid Films 409 (2002) 138-146.

Knoops et al., Ch. 27—"Atomic Layer Deposition" (pp. 1101-1134) in Handbook of Crystal Growth, edited by T. Kuech (Elsevier, 2015).

Siyi Xie et al., "Properties and Morphology of TiN Films Deposited by Atomic Layer Deposition," pp. 144-149 vol. 19, No. 2, Apr. 2014.

Meng Xin, et al., "Atomic Layer Deposition of Silicon Nitride Thin Films: A Review of Recent Progress, Challenges, and Outlooks," Materials 2016, pp. 1-20.

Lucero et al., "Silicon Nitride Atomic Layer Deposition: A Brief Review of Precursor Chemistry," Material Matters, 2018, 13.2.

Musschoot et al., "Atomic layer deposition of titanium nitride from TDMAT precursor," Microelectronic Engineering 86 (2009) 72-77.

International Preliminary Report on Patentability dated Apr. 21, 2022 in Application No. PCT/US2020/050628 in 10 pages.

\* cited by examiner

SMOOTH TITANIUM NITRIDE LAYERS AND METHODS OF FORMING THE SAME

BACKGROUND

Field

The disclosed technology generally relates to forming a titanium nitride layer, and more particularly to a smooth titanium nitride layer.

Description of the Related Art

Titanium nitride (TiN) has been widely used in fabrication of various structures in integrated circuits (ICs). For example, TiN has been used in diffusion barriers, various electrodes and metallization structures. Such wide usage of TiN in IC fabrication can be attributed to its structural, thermal and electrical properties. As the dimensions of various IC structures shrink, TiN is formed on features having increasingly smaller dimensions and complex topologies. For example, as the technology node scales to 10 nm node and beyond, there is a need for TiN layers, e.g., as diffusion barriers, that can conformally line high aspect ratio trenches and vias having dimensions as small as few nanometers. While techniques such as physical vapor deposition (PVD) and chemical vapor deposition (CVD) have been used in the IC industry to form TiN for decades, the increased need for conformality of TiN films to be deposited in smaller trenches or vias may eventually limit their usage. On the other hand, while atomic layer deposition (ALD) has been demonstrated for conformal deposition of TiN films, some electrical properties (e.g., conductivity) and physical properties (e.g., surface roughness) of the film may be inferior compared to TiN films formed using other techniques, e.g., physical vapor deposition (PVD). Thus, there is a need for atomic layer deposition methods for forming TiN-based films with superior conformality, while also having matching or superior electrical and physical properties, relative to TiN films formed by, e.g., PVD, for use in IC fabrication.

SUMMARY

In one aspect, a method of forming a thin film comprising titanium nitride (TiN) comprises providing a semiconductor substrate comprising a non-metallic surface. The method additionally comprises forming on the non-metallic surface a seed layer comprising silicon (Si) and nitrogen (N) by atomic layer deposition (ALD). The method further comprises forming on the seed layer a TiN layer by ALD. A stack comprising the TiN layer formed on the seed layer has a root mean square surface roughness that is less than about 8% of a thickness of the stack.

In another aspect, a method of forming a thin film comprising titanium nitride (TiN) comprises providing a semiconductor substrate comprising a non-metallic surface. The method additionally comprises forming on the non-metallic surface a seed layer comprising silicon (Si) and nitrogen (N) by thermal atomic layer deposition (ALD). The method further comprises forming on the seed layer a TiN layer by thermal ALD. A stack comprising the TiN layer formed on the seed layer has an electrical resistivity less than about 200 μΩ-cm In another aspect, a semiconductor structure comprises a semiconductor substrate comprising a non-metallic surface. The semiconductor structure additionally comprises a seed layer comprising silicon (Si) and nitrogen (N) conformally coating the non-metallic surface and a TiN layer conformally coating the seed layer. A stack comprising the TiN layer formed on the seed layer has a root mean square surface roughness that is less than about 8% of a thickness of the stack.

DETAILED DESCRIPTION

Figure 1:
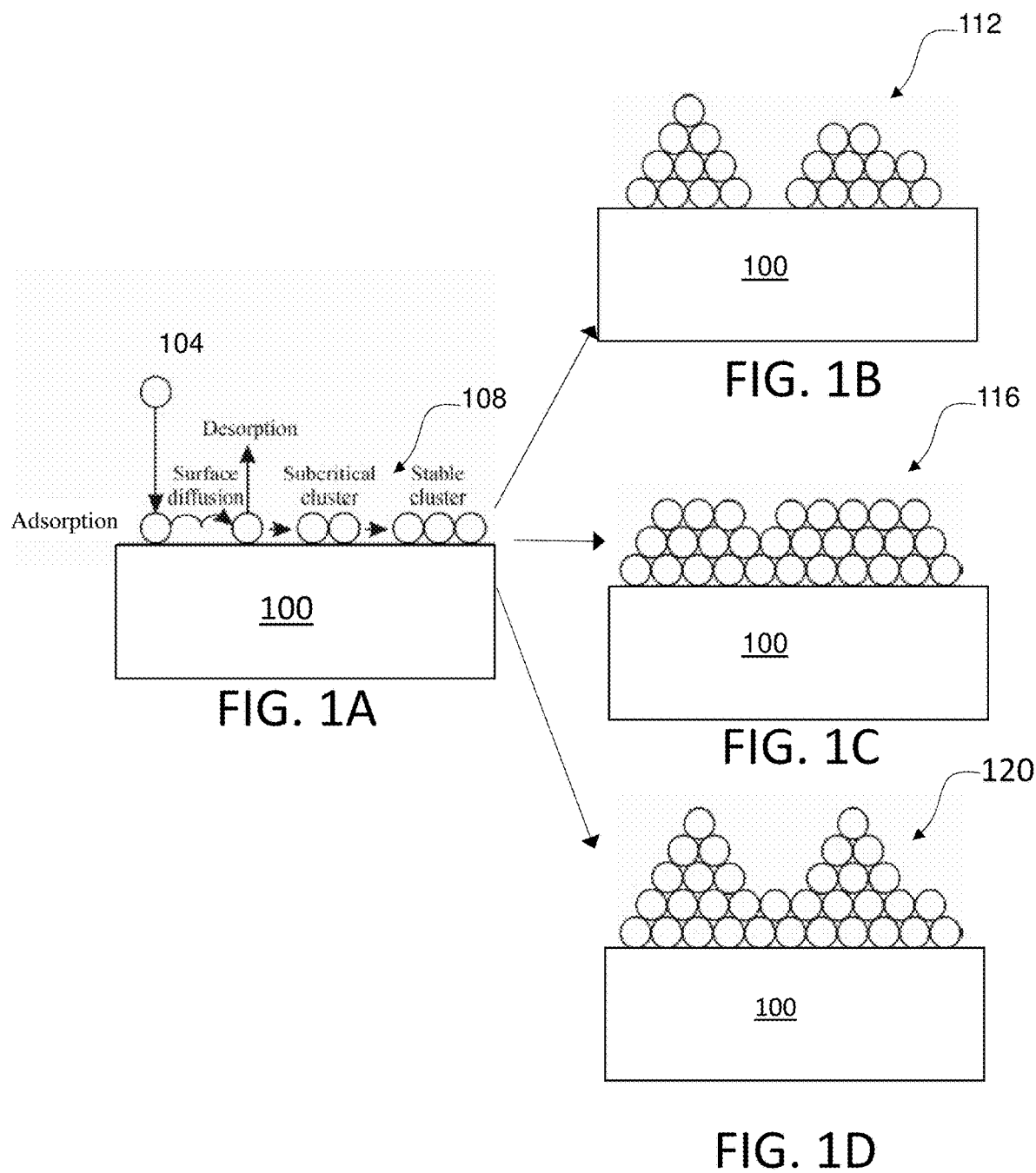
FIGS. 1A-1D schematically illustrate nucleation and growth mechanisms of thin films under different growth modes.

As described above, there is a need in the integrated circuit (IC) industry for conformal TiN films with superior electrical and physical properties, as well as methods of forming such films. To address these and other needs, disclosed herein is a thin film comprising a seed layer and a TiN layer formed on the seed layer and an atomic layer deposition (ALD) method of forming the thin film, which displays the conformality characteristic of a film deposited by ALD, while also having electrical and physical properties that are superior or matching those of TiN films formed by existing physical vapor deposition (PVD) and chemical vapor deposition (CVD) methods. In particular, a method of forming a thin film comprising titanium nitride (TiN) comprises forming on a non-metallic surface of a substrate a seed layer comprising silicon (Si) and nitrogen (N) by atomic layer deposition, e.g., thermal atomic layer deposition (ALD). The method further comprises forming on the seed layer a TiN layer by ALD, e.g., thermal ALD. The thin film comprising TiN deposited according to methods disclosed herein advantageously has a surface roughness that is about the same or lower relative to the TiN layer formed on the non-metallic surface by thermal ALD without the seed layer. Alternatively, or in addition, the thin film comprising TiN deposited according to methods disclosed herein advantageously has an average grain size that is about the same or lower relative to the TiN layer formed on the non-metallic surface by thermal ALD without the seed layer. Alternatively, or in addition, the thin film comprising TiN deposited according to methods disclosed herein advantageously has an electrical resistivity that is about the same or lower relative to the TiN layer formed on the non-metallic surface by thermal ALD without the seed layer.

As described herein, a compound referred to by its constituent elements without specific stoichiometric ratios thereof shall be understood to encompass all possible non-zero concentrations of each element unless explicitly limited. For example, titanium nitride (TiN) shall be understood to encompass all possible stoichiometric and nonstoichiometric compositions of titanium nitride that can be expressed by a general formula $Ti_xN$, where x>0, including TiN, $Ti_3N_4$, $Ti_4N_3$, $Ti_6N_5$, $Ti_2N$ and $TiN_2$ as well as other non-stoichiometric compositions of Ti and N. Similarly, silicon nitride (SiN) shall be understood to encompass all possible stoichiometric and nonstoichiometric compositions of silicon nitride that can be expressed by a general formula $Si_yN$, including $Si_3N_4$, where y>0. Similarly, titanium silicon nitride (TiSiN) shall be understood to encompass all possible stoichiometric and nonstoichiometric compositions of titanium silicon nitride that can be expressed by a general formula $Ti_xSi_yN$, where x>0 and y>0.

As described above, titanium nitride (TiN) plays an important role in integrated circuit (IC) fabrication. While techniques such as physical vapor deposition (PVD) and chemical vapor deposition (CVD) have been used in the IC industry to deposit TiN, the need for deposition methods for forming TiN-based films having high conformality without significant compromise in electrical and physical properties has been increasing.

In addition, while plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma may not reach deeper portions of high aspect ratio vias under some circumstances. In these circumstances, different portions of vias may be exposed to different amounts of the plasma, leading to undesirable structural effects of non-uniform deposition, such as thicker films being deposited near the opening of the via compared to deeper portions (sometimes called cusping or keyhole formation). For these reasons, a thermal ALD may be more advantageous, because thermal ALD does not depend on the ability of the plasma to reach portions of the surface being deposited on.

However, while thermal ALD techniques may be suitable for forming relatively conformal TiN films on topography, particularly topography with relatively high aspect ratios (e.g., over 1:1), the inventors have recognized that TiN films formed by thermal ALD can be inferior to TiN films formed by PVD or CVD in some respects, e.g., film roughness and electrical resistivity. In this regard, the inventors have discovered that some electrical properties and/or physical properties of ALD-grown TiN-based films can be affected by the mode of growth. In particular, the inventors have discovered that, while it may be desirable to grow the TiN-based films in a two-dimensional layer-by-layer growth mode in ALD, such layer-by-layer growth mode may not be easily achieved under some circumstances. The inventors have further discovered that growing TiN-based films by ALD in a layer-by-layer growth mode poses a particular challenge in IC fabrication where the TiN-based films are formed on non-metal surfaces, such as insulating surfaces, such as oxide and nitride surfaces or semiconductor surfaces such as doped and undoped silicon surfaces. The inventors have recognized that the degree to which the TiN-based films may be grown in a layer-by-layer growth mode may in turn be dependent on the initial growth mode that is dependent on the type of surface, as described herein without being bound to any theory, in reference to FIGS. 1A-1D.

FIG. 1A schematically illustrates nucleation of a TiN layer and FIGS. 1B-1D illustrate different growth modes of the TiN layer on different surfaces. Referring FIG. 1A, once precursor molecules 104 reach the surface of a substrate 100, they become physically adsorbed thereon. Some of the adsorbed molecules 104 may diffuse along the surface of the substrate 100 until they reach an energetically favorable position to be chemisorbed. The surface diffusion is governed by, among other things, the substrate temperature, the substrate material and kinetic energy of the adsorbed molecules. When the size of a nuclei formed by chemisorbed molecules exceeds a certain size (sometimes referred to as "critical size") determined by the trade-off between volume free energy and surface energy, the nuclei may become energetically stable, and start to grow in size. Thus formed layer 108 of stable nuclei continue to grow by incorporating additional precursor molecules 104. Subsequent film growth can be classified according to different growth modes, schematically illustrated in FIGS. 1B-1D.

FIG. 1B schematically illustrates a three-dimensional island growth mode, sometimes referred to as Volmer-Weber growth mode, which results in the formation of a layer 112 of three-dimensional islands. Without being bound to any theory, the island growth mode can dominate when the net surface free energy associated with three-dimensional islands is positive, indicating that deposited atoms are more strongly bound to each other than to the substrate. It will be appreciated that the energetics of ALD growth of TiN layers can favor the island growth mode, e.g., when the metallic TiN layers are deposited on some semiconductor and/or insulating material surfaces.

FIG. 1C illustrates a layer-by-layer growth mode, sometimes referred to as Frank-van der Merwe growth mode, which results in the formation of a relatively smooth two-dimensional layer 116. Without being bound to any theory, the layer-by-layer growth mode can dominate when the deposited atoms are more strongly bound to the substrate than to each other, such that a stable two-dimensional layer 116 is energetically favored. The layer-by-layer growth mode can be sustained when there is a continuous decrease in bonding energy between the layers from the first monolayer to the bulk-crystal value of the TiN layer.

While FIGS. 1B and 1C are two different possible growth modes of thin films, it will be appreciated that, under some circumstances, a growth mode that is intermediate between a layer-by-layer growth mode and a three-dimensional growth mode is possible. FIG. 1D illustrates an example of an intermediate growth mode known as Stranski-Krastanov (SK) growth mode. Without being bound to any theory, the SK growth may occur in thin film growth that commences in a layer-by-layer mode. When layer-by-layer growth becomes unfavorable after the formation of one or more monolayers, an island growth mode starts to dominate over a layer-by-layer growth mode, resulting in thin film structure 120 in which three dimensional islands are formed on a two-dimensional initial layer. The SK growth mode can occur as a strain relaxation mechanism (strain-induced roughening).

In addition to the interaction between the deposit and the substrate, other factors such as the substrate temperature and deposition rate can significantly affect the nucleation and early growth processes, which in turn affects the final nanostructure or microstructure of the resulting thin film. For example, deposition at relatively high substrate temperatures and low deposition rates may promote the growth of relatively large grains, while relatively low substrate temperatures and high deposition rates may favor the formation of smaller grains.

It has been discovered that, when TiN is grown by ALD on various surfaces of interest in IC fabrication, such as dielectric and semiconductor surfaces, the ALD growth initializes in a three-dimensional island growth mode or a SK growth mode. For example, under some circumstances, ALD growth of TiN on substrate surfaces including doped and undoped Si, $SiO_2$, $Si_3N_4$ and other high K or low K materials may proceed in an island growth mode or the SK growth mode. The inventors have discovered that, in part owing to the initial growth mode of either an island or SK growth mode, subsequent growth of TiN by ALD often results in a film morphology that is undesirable for various applications of ultrathin conformal TiN for high aspect ratio structures, as illustrated in FIG. 2.

Figure 2:
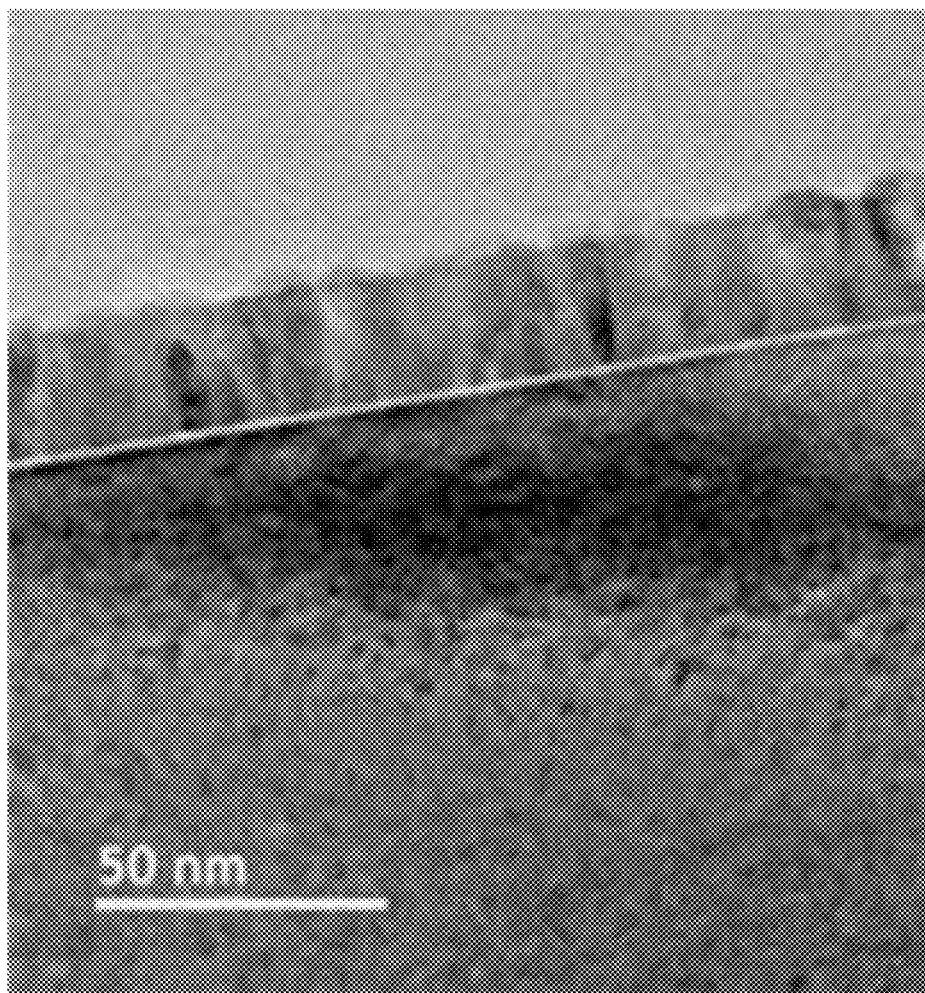
FIG. 2 is a cross-sectional transmission electron micrograph of a TiN layer grown on an oxide-coated silicon substrate by thermal atomic layer deposition.

FIG. 2 is a cross-sectional transmission electron micrograph of a TiN layer grown by thermal ALD on a Si substrate coated with native oxide. After an initial film grown in either a three-dimensional island or SK growth mode, the ALD growth of TiN is often characterized by a competitive growth of adjacent crystals with different orientations, resulting, under some circumstances, in V-shaped grains close to the nucleation layer and culminating in a columnar morphology at higher film thicknesses. As illustrated in FIG. 2, the resulting film morphology includes facetted column tops that give rise to a significant surface roughness and column boundaries having lower density relative to the grains. It will be appreciated that the column boundaries can have significantly worse diffusion barrier properties relative to the grains themselves, and may serve as paths of least resistance for transportation of undesirable contaminant through the TiN layer.

The inventors have discovered that, when a seed layer comprising silicon (Si) and nitrogen (N) is formed on the non-metal surface prior to the growth of a TiN layer by thermal ALD, an initial three-dimensional or SK growth mode can be suppressed and a layer-by-layer growth mode can be promoted. Among other reasons, this may be because the seed layer comprising Si and N wets the non-metal surface with relatively low contact angles such that the resulting layer uniformly covers large areas of the non-metal surface without substantially forming islands, such that, the initial stages of growth tend more to favor a layer-by-layer growth mode on substrate surfaces on which ALD TiN would normally favor a three-dimensional island or SK growth mode as described above. Thus, depositing a TiN layer by ALD directly on some semiconductor and/or insulating materials, particularly inorganic layers comprising silicon, e.g., Si, $SiO_2$ and $Si_3N_4$, may result in an initial growth characterized by an island or SK growth mode followed by a columnar growth as described above. In contrast, when ALD of TiN is preceded by a thin seed layer or region comprising Si and N formed on the non-metal surface in a layer-by-layer mode, the TiN layer formed thereon by thermal ALD may continue to grow in a layer-by-layer mode.

Figure 3:
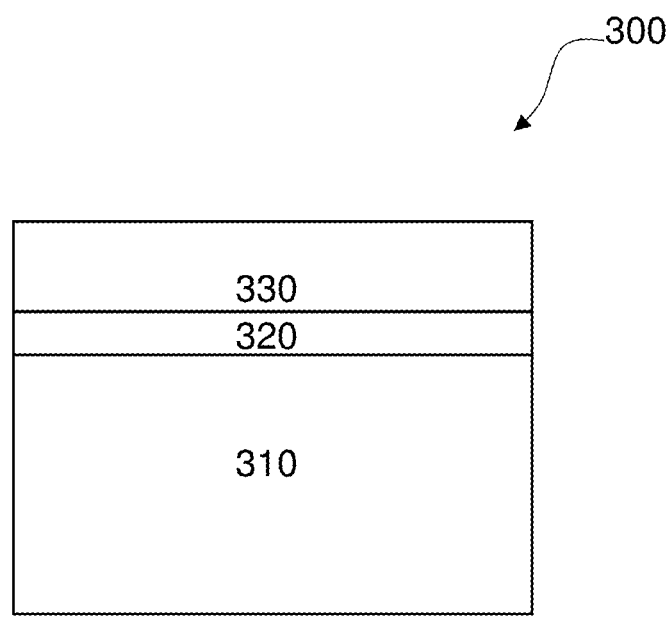
FIG. 3 schematically illustrates a cross-sectional view of a semiconductor structure comprising a TiN layer formed on a seed layer comprising Si and N, according to embodiments.

FIG. 3 schematically illustrates a cross-sectional view of a semiconductor thin film structure 300 comprising a TiN layer formed on a seed layer comprising Si and N that may be formed using methods according to embodiments disclosed herein. The semiconductor thin film structure 300 comprises a substrate 310 comprising a non-metal surface, e.g., a dielectric and/or a semiconductor surface, on which a seed layer 320 comprising Si and N is formed by atomic layer deposition (ALD), followed by a TiN layer 330 formed by ALD that is substantially thicker than the seed layer 320. Non-limiting examples of the seed layer include silicon nitride (SiN) and titanium silicon nitride (TiSiN).

Figure 4:
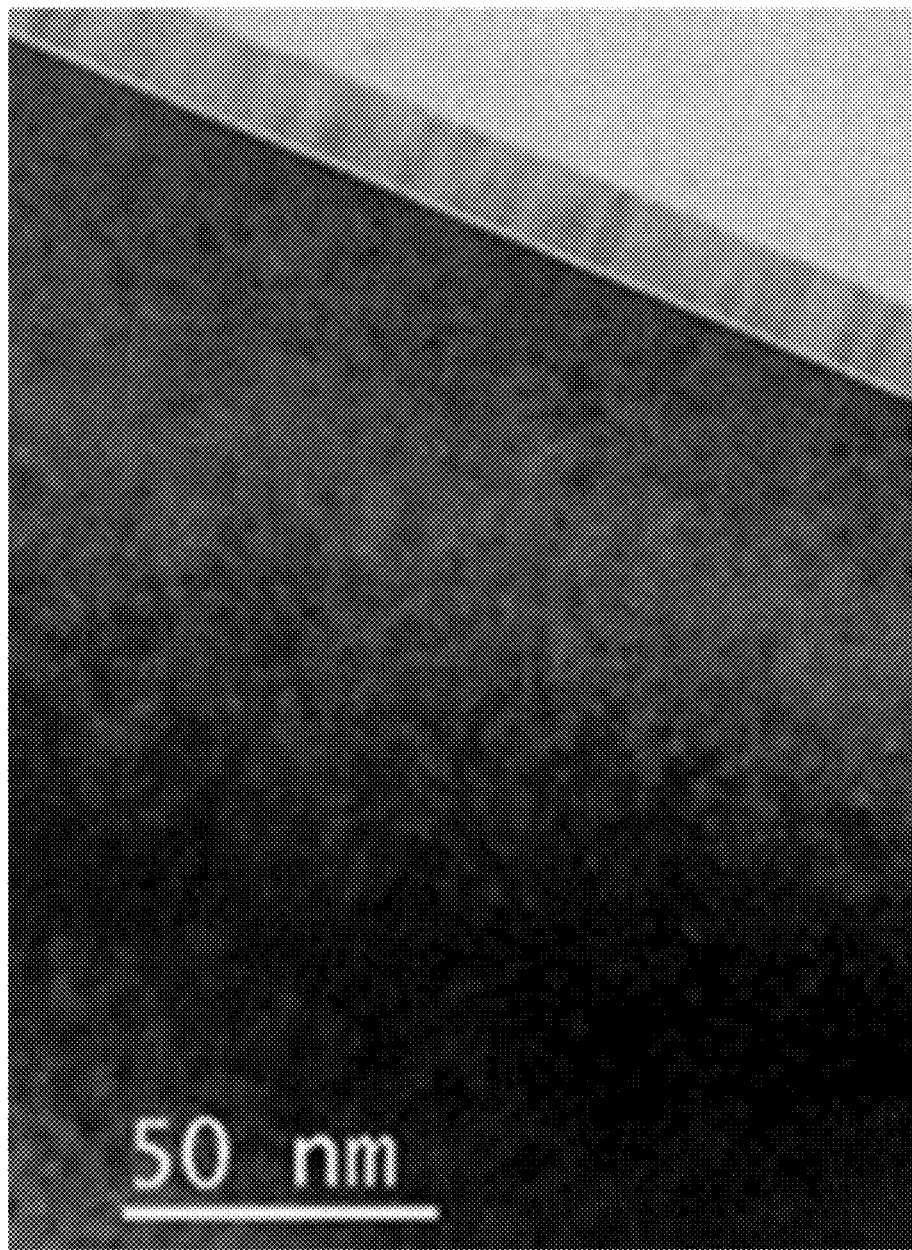
FIG. 4 is a cross-sectional transmission electron micrograph of a TiN layer grown on a TiSiN seed layer grown on an oxide-coated silicon substrate by thermal atomic layer deposition, according to embodiments.

FIG. 4 is a cross-sectional transmission electron micrograph of TiN layer grown by thermal ALD on a TiSiN seed layer grown by thermal ALD, according to embodiments, on a native-oxide covered Si substrate. The inventors have observed that, after an initial seed layer of TiSiN which grown in a layer-by-layer growth mode, the thermal ALD growth of TiN also proceeds in a layer-by-layer mode such that, unlike TiN grown directly on the same surface as illustrated in FIG. 2, the competitive growth of adjacent crystals with different orientations characterized by columnar growth of V-shaped grains and the relatively high surface roughness resulting therefrom are not apparent. The resulting seeded TiN layer has superior properties including one or more of superior conformality, lower surface roughness, smaller average grain size, higher electrical conductivity and/or barrier characteristics compared to the same TiN layer formed directly on a non-metal surface without the seed layer.

Figure 5A:
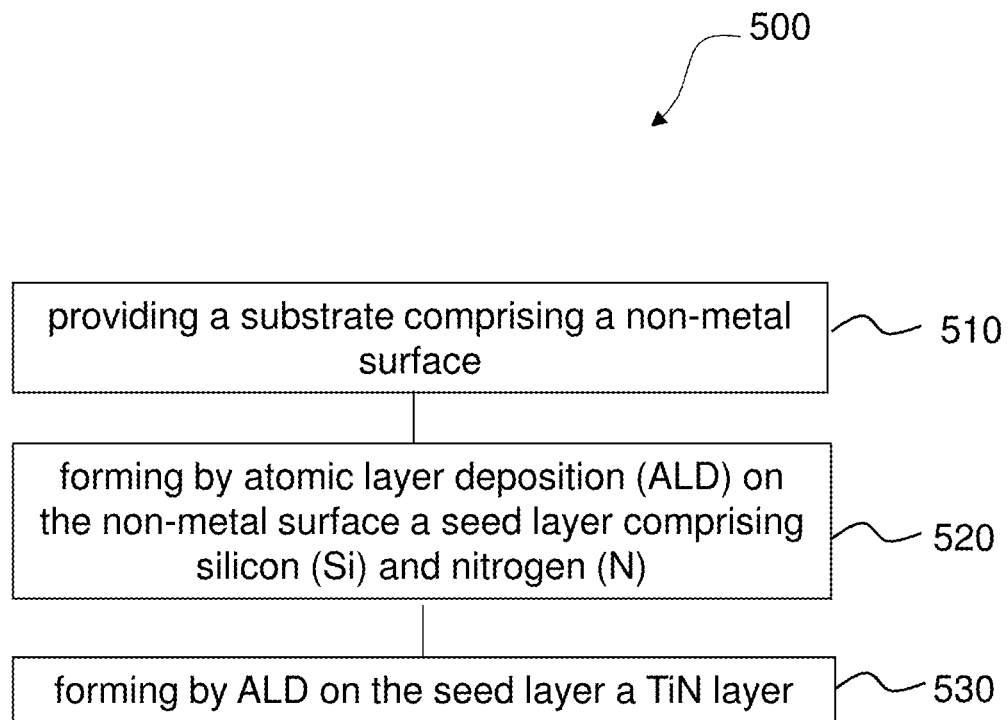
FIG. 5A schematically illustrates a flow chart of a method of forming by atomic layer deposition a TiN layer on a seed layer comprising Si and N, according to embodiments.

FIG. 5A schematically illustrates a flow chart of a method 500 of forming by thermal ALD a TiN layer on a seed layer comprising Si and N, according to embodiments. The method includes providing 510 a substrate comprising a non-metal surface in a reaction chamber configured for thermal ALD. The method additionally comprises forming 520 by thermal atomic layer deposition (ALD) on the non-metal surface a seed layer or region comprising silicon (Si) and nitrogen (N). The method further comprises forming 530 by thermal ALD on the seed layer a TiN layer substantially thicker than the seed layer.

The resulting thin film stack schematically illustrated in FIG. 4 advantageously has a surface roughness that is about the same or lower relative to a TiN layer that would be formed using the same process recipe directly on the non-metallic surface without the seed layer, and/or an electrical resistivity that is about the same or lower relative to the TiN layer that would formed using the same process recipe directly on the non-metallic surface without the seed layer. Thus formed thin film structure may have a morphology similar to the thin film structure illustrated in FIG. 4. Referring to FIG. 4, it will be appreciated that, while the seed layer 320 comprising Si and N and the TiN layer 330 are depicted as distinct layers, in practice an interface formed by the seed layer 320 and the TiN layer 330 may not be atomically abrupt or distinct due atomic diffusion during and/or after the formation of the thin film structure 300. Thus, the interface region may have a composition that is intermediate between the bulk regions of the seed layer 320 comprising Si and N and the TiN layer 330. In this regard, the seed layer 320 comprising Si and N and the TiN layer 330 may be interchangeably referred to herein as a seed region 320 comprising Si and N, and a TiN region 330, respectively.

As described herein and throughout the specification, it will be appreciated that the semiconductor substrate on which the seeded TiN thin film can be implemented in a variety of substrates, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

According to certain embodiments, the substrate can also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer. In addition, it will be appreciated that the various structures described herein can be at least partially formed in an epitaxial layer formed at or near a surface region.

Furthermore, the substrate can include a variety of structures formed thereon, e.g., diffusion regions, isolation regions, electrodes, vias and lines to name a few, on which any structure comprising the TiN layer according to embodiments may be formed, including topological features such as vias, cavities, holes or trenches having one or more semiconductor or dielectric surfaces. Thus, the non-metal surface on which the seed layer according to embodiments is formed can include a semiconductor surface, e.g., a doped or undoped Si surface, and/or a dielectric surface, e.g., an interlayer dielectric (ILD) surface, a mask or a hard mask surface or a gate dielectric surface, to name a few, which can include an inorganic insulator, an oxide, a nitride, a high K dielectric, a low K dielectric, or carbon, to name a few dielectric materials.

As described herein and throughout the specification, a reactor chamber refers to any reaction chamber including a single wafer processing reaction chamber or a batch wafer processing reaction chamber that is suitably configured for thermal atomic layer deposition (ALD). In a thermal ALD reactor, the substrate may be placed on a suitable substrate such as a susceptor or a carrier boat. The substrate may be directly heated by conduction through a heated susceptor, or indirectly heated by radiation from a radiation source such as a lamp or by convection through a heated chamber wall.

Generally in an ALD process, reactants or precursors, e.g., oxidizing and reducing reactants, are alternatingly introduced into a reaction chamber having disposed therein a substrate. The introduction of one or more reactants or precursors may be in turn be alternated with a purge and/or a pump out process for removing excess reactants or precursors from the reaction chamber. The reactants may be introduced into the reaction chamber under a condition over a suitable period of time such that the surface of the substrate becomes at least partly saturated with the precursors or reactants and/or a reaction product of the reactants. Excess or residual precursors or reactants may then be purged and/or pumped out of the reaction chamber. A pump out process may be performed by a suitable vacuum pumping process and a purge step may be performed by introducing a non-reactive or an inert gas, e.g., nitrogen or a noble gas, into the reaction chamber. In the context of layers formed by thermal ALD in examples hereinbelow, in which one or more of SiN, TiSiN and TiN are formed, there are generally two categories of precursors or reactants, namely nitrogen (N) precursors and non-nitrogen precursors. The non-nitrogen precursors include Si precursors and Ti precursors.

In the following, in reference to FIG. 5B, example implementations of forming a seed layer or region comprising silicon (Si) and nitrogen (N) by exposing the non-metal surface to a Si precursor as an initial non-nitrogen precursor are described. In reference to FIG. 5C, example implementations of forming a TiN layer on the seed layer are described.

Forming a Seed Layer Comprising Si and N by Thermal ALD

Referring back to FIG. 5A, after providing 510 the substrate (substrate 310 in FIG. 3) comprising a non-metal surface in the reaction chamber, the method 500 proceeds to forming 520 by thermal atomic layer deposition (ALD) on the non-metal surface a seed layer or region comprising Si and N (corresponding to the seed layer 320 in FIG. 3). FIG. 5B illustrates forming a seed layer according to some embodiments. The seed layer comprising Si and N may be formed in a number of successive deposition steps, each of which may in turn comprise substeps and is performed one or more times, as described herein.

Figure 5B:
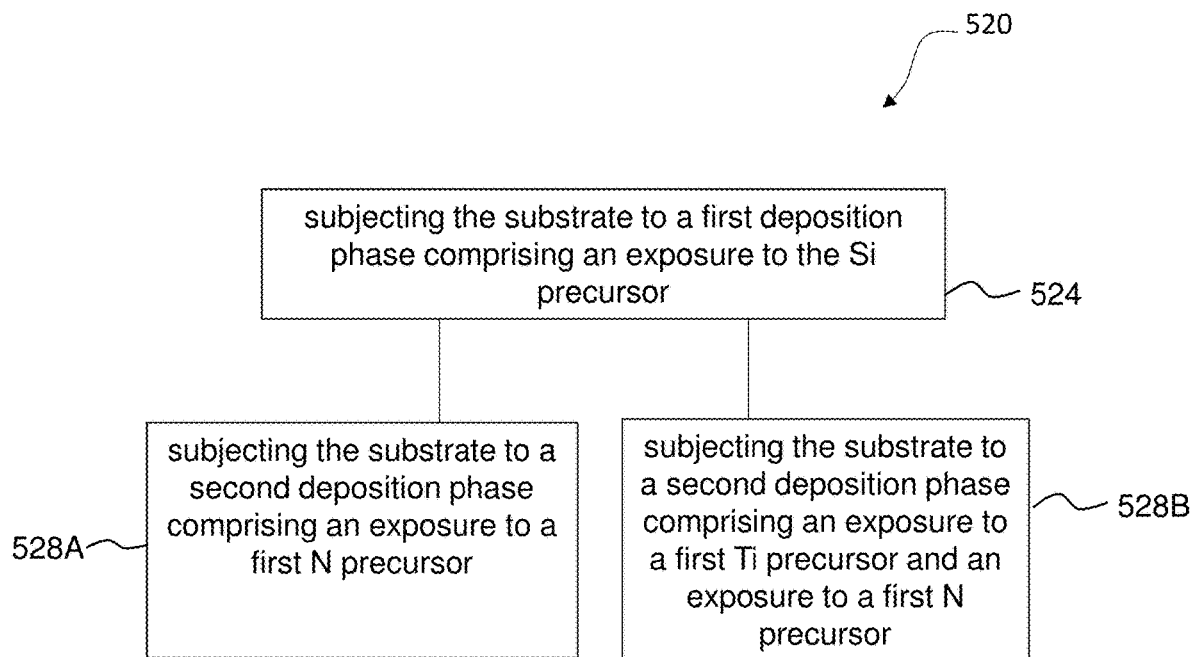
FIG. 5B schematically illustrates a flow chart of a method of forming a seed layer comprising Si and N by atomic layer deposition, according to embodiments.

Referring to FIG. 5B, in various embodiments, forming 520 the seed layer or region comprises subjecting 524 the substrate to a first deposition phase comprising an exposure to a Si precursor. In some embodiments, forming 520 the seed layer additionally comprises subjecting 528A the substrate to a second deposition phase that includes an exposure to a first N precursor. In these embodiments, the first and second deposition phases can be cyclically repeated to form a seed layer comprising Si and N, e.g., SiN. In some other embodiments, forming 520 the seed layer additionally comprises subjecting 528B the substrate to a second deposition phase that includes a combination of an exposure to a first Ti precursor and an exposure to a first N precursor. In these embodiments, the first and second deposition phases can be cyclically repeated to form a seed layer comprising Si, N and Ti, e.g., TiSiN. Forming 520 the seed layer or region comprises one or more cycles each comprising subjecting 524 the substrate to one or more first deposition phases and subjecting 528A or 528B the substrate to one or more second deposition phase(s), as illustrated in FIG. 5B, which can be performed multiple times. Each of subjecting 524 the substrate to a first deposition phase and subjecting 528A or 528B the substrate to a second deposition phase, in turn, can comprise one or more exposures to precursors, such as in pulses, as described below.

Subjecting 524 the substrate to a first deposition phase comprises performing one or more exposures of the substrate to a Si precursor. Each exposure to the Si precursor is such that the surface of the substrate is substantially fully or partly saturated with the Si precursor. After the one or more exposures to the Si precursor, excess or residual Si precursor or its reaction products that do not remain adsorbed or chemisorbed on the surface of the substrate may be pumped or purged out.

In some embodiments, the exposure to the Si precursor may be performed a plurality of times in sequence before the second deposition phase(s). Advantageously, under some circumstances, exposing the substrate to the Si precursor more than once may result in a higher level of surface saturation, e.g., when substantial stearic hindrance effect exists, by exposing more reactive sites for the Si precursor adsorption.

Still referring to FIG. 5B, in some embodiments, subjecting 528A the substrate to one or more second deposition phases can comprise performing one or more exposures of the substrate to a first N precursor. Each exposure to the first N precursor is such that the surface of the substrate is fully or partly saturated with the first N precursor. After the one or more exposures to the first N precursor, excess or residual N precursor or its reaction products that do not remain adsorbed or chemisorbed on the surface of the substrate may be pumped or purged out.

In some embodiments, the exposure to the first N precursor may be performed a plurality of times in sequence before returning to the first deposition phase. Advantageously, under some circumstances, exposing the substrate to the first N precursor more than once may result in a higher level of surface saturation, e.g., when substantial stearic hindrance effect exists.

When forming 520 the seed layer or region comprises cyclically subjecting the substrate to one or more cycles each comprising subjecting 524 the substrate to the first deposition phase comprising exposure(s) to a Si precursor and subjecting 528A the substrate to the second deposition phase comprising an exposure(s) to a first N precursor, as illustrated in FIG. 5B, the resulting seed layer comprising Si and N may include a SiN layer or region.

The inventors have found that, as shown in the illustrated embodiment including subjecting 524 the substrate to the first deposition phase and subjecting 528A the substrate to the second deposition phase, forming 520 the seed layer by exposing the semiconductor substrate first to a Si precursor may be particularly advantageous in enhancing the layer-by-layer growth mode of the seed layer. However, embodiments are not so limited and in other embodiments, the semiconductor substrate may first be exposed to the N precursor in a cyclical deposition process.

It will be appreciated that, in various embodiments, the frequency and the number of repetition of the exposures of the substrate to the Si precursor and/or to the first N precursor as well as the number of repetition of cycles as described herein can be varied to obtain a desired thickness and stoichiometry of the resulting seed layer, based on various considerations including susceptibility to stearic hindrance effects of the precursors.

Still referring to FIG. 5B, in some other embodiments, subjecting 528B the substrate to one or more second deposition phase(s) comprises subjecting the substrate to one or more exposures to a first Ti precursor and one or more exposures to a first N precursor. Each exposure to the first Ti precursor is such that the surface of the substrate is substantially or partly saturated with the first Ti precursor. After exposing the substrate to the first Ti precursor, excess or residual first Ti precursor or its reaction products that do not remain adsorbed or chemisorbed on the surface of the substrate may be pumped or purged out. Similarly, each exposure to the first N precursor is such that the substrate is substantially or partly saturated with the first N precursor. After exposing the substrate to the first N precursor, excess or residual first N precursor or its reaction products that do not remain adsorbed or chemisorbed on the surface of the substrate may be pumped or purged out. Subjecting 528B the substrate to one or more second deposition phases each comprising one or more exposures to a first Ti precursor and one or more exposures to a first N precursor may locally form one or more monolayers of TiN. When added to subjecting 524 the substrate to the first deposition phase comprising an exposure to the Si precursor, the resulting seed layer may comprises a TiSiN layer or region.

In some embodiments, the exposure to the first Ti precursor and/or the exposure to the first N precursor may be performed a plurality of times. Advantageously, under some circumstances, exposing the substrate to the Ti precursor and/or the first N precursor more than once may result in a higher level of surface saturation e.g., when substantial stearic hindrance effect exists. Thus, multiple second deposition phases each comprising Ti and N exposures conducted in sequence maybe performed between Si exposures.

In embodiments where subjecting 528B the substrate to one or more second deposition phases comprises subjecting the substrate to one or more exposures to a first Ti precursor and one or more exposures to a first N precursor, it will be appreciated that the order of exposures to the a first Ti precursor and to a first N precursor may be selected depending on the circumstances. In some implementations, the one or more exposure to the first Ti precursor may immediately follow subjecting 524 the substrate to one or more first deposition phases each comprising one or more exposures to the Si precursor. For example, directly following one or more exposures to the Si precursor with one or more exposures to the first Ti precursor may prevent formation of SiN, which may be advantageous for lowering electrical resistivity by use of a TiSiN seed layer. However, under some other implementations, the one or more exposures to the first N precursor may immediately follow subjecting 524 the substrate to one or more first deposition phases each comprising one or more exposures to the Si precursor, such that one or more monolayers of SiN are formed, which may be advantageous for improving barrier characteristics of the stack.

When forming 520 the seed layer or region comprises cyclically subjecting the substrate to one or more cycles each comprising subjecting 524 the substrate to one or more first deposition phases each comprising an exposure to a Si precursor and subjecting 528B the substrate to one or more second deposition phases each comprising alternating exposures to a Ti precursor and a N precursor, as illustrated in FIG. 5B, the resulting seed layer comprising Si, Ti and N may include a TiSiN layer or region.

The inventors have found that, as shown in the illustrated embodiment including subjecting 524 the substrate to one or more first deposition phases and subjecting 528B the substrate to one or more second deposition phases, forming 520 the seed layer by initially exposing the semiconductor substrate to a Si precursor may be particularly advantageous in enhancing the layer-by-layer growth mode of the seed layer. However, embodiments are not so limited in other embodiments, the semiconductor substrate may first be exposed to the Ti precursor or the N precursor.

It will be appreciated that in various embodiments, the frequency and repetition of the exposures of the substrate to the Si precursor, the first Ti reactant and/or the first N precursor can be varied to obtain a desired thickness and stoichiometry, based on various considerations including susceptibility to stearic hindrance effects of the precursors.

In yet some other embodiments, one or more cycles each including subjecting 524 the substrate to a first deposition phase and subjecting 528A the substrate to a second deposition phase comprising an exposure to a first N precursor may be alternatingly performed with subjecting 528B the substrate to one or more second deposition phases comprising an exposure to a first Ti precursor and the first N precursor. In these embodiments, layers or regions of SiN may be alternatingly formed with layers or regions of TiN to form a TiSiN layer or region. In some implementations, due to sufficient atomic diffusion, the resulting TiSiN layer may be homogenous without distinguishable SiN or TiN regions. In some other implementations, the due to insufficient atomic diffusion, the resulting TiSiN layer may comprise a nanolaminate structure comprising distinguishable SiN or TiN regions.

According to various embodiments, non-limiting examples of the first Ti precursor for forming the seed layer or region may include titanium tetrachloride ($TiCl_4$), tetrakis(dimethylamino)titanium (TDMAT) or tetrakis(di thylamino)titanium (TDEAT).

According to various embodiments, non-limiting examples of the first N precursor for forming the seed layer or region may include ammonia ($NH_3$), hydrazine ($N_2H_4$) or monomethylhydrazine ($CH_3(NH)NH_2$, "MMH").

According to various embodiments, non-limiting examples of the inert gas for purging may include nitrogen $N_2$ or a noble gas such as Ar.

According to some embodiments, the Si reactants or precursors that are particularly suitable for enhancing the layer-by-layer growth mode may be a hydride precursor. Examples of the hydride precursor include silane ($SiH_4$) and disilane ($Si_2H_6$).

According to some other embodiments, the Si reactants or precursors that are particularly suitable for enhancing the layer-by-layer growth mode may be a silicon chloride or a chlorosilane. Examples include silicon tetrachloride ($SiCl_4$), monochlorosilane ($SiH_3Cl$, "MCS"), dichlorosilane ($SiH_2Cl_2$, "DCS"), trichlorosilane ($SiHCl_3$), hexachlorodisilane ($Si_2Cl_6$, "HCDS") and octachlorotrislane ($Si_3Cl_8$, "OCTS"). The inventors have found that the seed layer comprising Si and N, e.g., a SiN layer or a TiSiN layer, may be desirably formed using a silicon and chlorine-containing Si precursor which results in self-limiting saturation of the surface by the silicon and chlorine-containing Si precursor under a wide variety of conditions. Without being bound to any theory, the inventors have found that the above Si precursors, when introduced as the first non-nitrogen precursor to form the seed layer, can be advantageous for growing the seed layer and the subsequent TiN layer in a layer-by-layer growth mode, compared to other Si precursors. The layer-by-layer growth mode is achieved through improved wetting of the substrate surface by the precursors and seed layer, which may be characterized by a small contact angle between nuclei at early stages of growth and the substrate surface. As a result of the layer-by-layer growth mode, improved conformality and reduced surface roughness may be achieved, which can be advantageous for lining high aspect ratios with small dimensions. Further, without being bound to any theory, the self-limiting saturation of the chlorine-containing Si precursor may enable more precise control of composition in the direction of growth.

Additional benefits may exist in introducing a Si precursor as the first precursor in a cyclical process for forming the seed layer. In some embodiments, the seed layer/TiN layer stack may be formed in a via or a trench for forming contacts directly made to a Si substrate. In these circumstances, after forming the via or the trench, the exposed Si substrate, on which the seed layer is to be formed, may have a silicon oxide formed thereon, e.g., a native oxide. Because their presence can increase the contact resistance or even lead to an open circuit, prior to depositing a barrier structure on the substrate, some methods include a separate oxide removal or preclean process, which can be in situ or ex situ and can be wet or dry. Such removal process may increase process time and cost, and may also introduce undesirable contaminants such as fluorine. Advantageously, according to embodiments, forming the seed layer using some of the above Si precursors under various conditions disclosed herein including temperatures and pressure may obviate the need for such separate oxide removal process, among various additional unexpected benefits. This is realized by exposing the substrate to the Si precursor as the first precursor prior to exposing the substrate to a N precursor or a Ti precursor. Thus, in some embodiments, the substrate comprises a native oxide formed thereon, and forming the seed layer or region comprises exposing the oxide to the Si precursor as a first precursor, during which the oxide on the substrate may be removed, such as being volatilized, thereby exposing an underlying silicon surface to initiate the deposition of the seed layer. Particularly effective Si precursor effective for the oxide removal includes a halide-free inorganic silane, e.g., $SiH_4$ or $Si_2H_6$. Thus, using a silane as the silicon-containing precursor for the deposition of the seed layer or region can synergistically provide an in situ solution for combining the oxide removal and the seed layer or region deposition in the same reactor chamber using the same reactants and as part of a single process sequence.

Various technical advantages and benefits described herein can be realized when the seed layer is formed a substrate temperature of 350° C. to 800° C., 450° C. to 750° C., 500° C. to 700° C., 550° C. to 650° C., or in a range defined by any of these values, for instance about 600° C., according to embodiments.

According to embodiments, total reaction chamber pressure or partial pressures of the of any of the individual precursors in the reaction chamber during exposing the substrate to the Ti precursor, the Si precursor and/or the N precursor, may be 0.001.0-3.0 torr, 3.0-5.0 torr, 5.0-7.0 torr, 7.0-10.0 torr, 10.0-15.0 torr, or a pressure in range defined by any of these values. In each of the exposures to the Ti precursor, the N precursor and/or the Si precursor, the respective precursor can make up 1-2%, 2-5%, 5-10%, 10-20%, 20-50%, 50-100% of the total amount of gas molecules in the reaction chamber, or a percentage in a range defined by any of these values. The inventors have discovered that, under some circumstances, when the total or partial pressure is outside of these values, conformality or step coverage may start to degrade, among other things.

In various embodiments, the exposure times or pulse times of precursors are in the range of about 0.1 and 60 seconds.

According to embodiments, when forming a seed layer comprising Si and N, e.g., a seed layer comprising a SiN layer, a ratio of the number of exposures of the Si precursor to the number of exposures of the N precursor may be 1:2, 1:1, 3:1, 5:1, 7:1, 9:1 or a ratio in a range defined by any of these values. Under the combination of process conditions described herein for forming the seed layer or region comprising Si and N, the ratio of the exposures to the precursors is such that Si is present in the seed layer or region at an average concentration exceeding about 40%, 50%, 60%, 70%, 80%, 90%, or a value in a range defined by any of these values, on the basis of the total number of atoms in the seed layer.

According to embodiments, when forming a seed layer comprising Ti, Si and N, e.g., seed layer comprising a TiSiN layer, a ratio of the number of exposures of the Ti precursor or the N precursor to the number of exposures of the Si precursors may be 5:1, 6:1, 7:1, 8:1, 9:1, 10:1 or a ratio in a range defined by any of these values. Under the combination of process conditions described herein for forming the seed layer or region comprising Ti, Si and N, the ratio of the exposures to the precursors is such that Si is present in the seed layer or region at an average concentration exceeding about 10%, 15%, 20%, 25%, 30%, 5%, 40%, or a value in a range defined by any of these values, on the basis of the total number of atoms in the seed layer.

As described herein, the seed layer or region comprising Si and N, e.g., a SiN layer or region, can be formed by alternatingly exposing the substrate to one or more phases each comprising an exposures to a Si precursor and a N precursor. Alternatively, the seed layer or region comprising Ti, Si and N, e.g., a TiSiN layer or region, can be formed by alternatingly exposing the substrate to one or more phases each comprising exposures to a Ti precursor, a Si precursor and a N precursor. In some embodiments, after performing the one or more cycles to form the seed layer or region comprising either Si and N or Ti, Si and N, the seed layer formation may be completed by exposing the substrate one or more times to the Si precursor as the last precursor. The inventors have found that exposing the substrate to the Si precursor as the last precursor, e.g., instead of the N precursor, can enhance Ohmic contact between the seed layer and the subsequent TiN layer formed thereon, thereby reducing the electrical resistivity, and/or the diffusion barrier performance of the resulting seed layer/TiN layer stack.

In some embodiments, the precursor exposure sequence can be tailored to provide a concentration gradient or difference in Si and N in a layer growth direction for a seed layer comprising Si and N, or a concentration gradient or difference in Ti, Si and N in a layer growth direction for a seed layer comprising Ti, Si and N. For example, exposing the substrate to the Si precursor as the last precursor can create a concentration gradient having, in a layer normal direction, increasing silicon concentration and decreasing nitrogen concentration and, in the seed layer comprising Ti, Si and N, decreasing titanium concentration. Such concentration gradients can be optimized for enhanced Ohmic contact, electrical resistivity, and/or the diffusion barrier performance of the resulting seed layer/TiN layer stack.

In addition, in some embodiments, a gradient in Si concentration is created in the seed layer such that the bottom interface region near the substrate has a Si concentration that is higher than the average Si concentration. For example, the bottom interface region of the seed layer can have a silicon concentration exceeding 50%, 70%, 90%, 99% or a value in a range defined by any of these values, on the basis of an atomic concentration in the seed layer or region. When the seed layer is formed to have such a Si concentration gradient, the bottom interface region, which may be more silicon-rich compared to upper regions of the seed layers, may reduce the contact resistance and/or may provide improved resistance to diffusion of chemical elements used in forming the underlying metal, e.g., Cl or F. For example, when the seed layer directly contacts a tungsten-based metal, a seed layer/TiN stack having a higher Si content near the bottom interface may form an improved diffusion barrier to the gases such as fluorine used in forming tungsten-based contact. In addition, similar arrangement may also provide improved diffusion barrier functionality against dopants in an underlying Si active region, e.g., polysilicon or single-crystal silicon having doped regions. In addition, the Si-rich interface with the underlying material may provide improved contact resistance.

However, embodiments are not so limited and in some other embodiments, a gradient in Si concentration is created in the seed layer such that the top surface region of the seed layer or the interface region between the seed layer and the subsequent TiN layer has a Si concentration that is higher than the average Si concentration. For example, the top surface region of the seed layer can have a silicon concentration exceeding 50%, 70%, 90%, 99% or a value in a range defined by any of these values, on the basis of an atomic concentration in the seed layer or region.

In various embodiments, the seed layer may advantageously be at least partially amorphous. At least partially amorphous seed layer may advantageously be more favorable for growing the seed in a layer-by-layer growth mode. In addition, the TiN layer that subsequently grows on the seed layer that is at least partially amorphous may more favorably grow in a layer-by-layer mode without being affected by the crystalline orientation or texture of the underlying seed layer. To achieve these and other benefits, in some embodiments, the seed layer may be formed to be substantially entirely amorphous or comprise nanocrystalline regions surrounded by an amorphous matrix. For example, the seed layer may include TiSi, TiN, SiN, or TiSiN nanocrystals in an amorphous matrix of SiN or TiSiN. According to various embodiments, a seed layer comprising TiSiN may be at least partly amorphous when the atomic concentration of Si exceeds 10%, 15%, 20% or 25%, depending on the circumstances.

In summary, forming 520 the seed layer or region comprising Si and N comprises alternatingly performing one or more cycles each comprising one or more first deposition phases each comprising an exposure to a Si precursor and one or more second deposition phases each comprising an exposure to a N precursor or exposures to both a Ti precursor and a N precursor. According to some embodiments, each of the one or more cycles comprises one or more first deposition phases in which the substrate is exposed to a Si precursor and one or more second deposition phases in which the substrate is exposed to a N precursor, such that the resulting seed layer comprises Si and N, e.g., a SiN layer or region. According to some other embodiments, each of the one or more cycles comprises one or more first deposition phases in which the substrate is exposed to a Si precursor and one or more second deposition phases in which the substrate is alternatingly exposed to a Ti precursor and a N precursor, such that the resulting seed layer comprises Si, Ti and N, e.g., a TiSiN layer or region. According to various embodiments, the frequency and the number of exposures of the substrate to each of the Ti precursor, the N precursor and the Si precursor may be tailored to obtain a desired stoichiometry, thickness and degree of crystallinity, as described infra.

Forming a TiN Layer on a Seed Layer by Thermal ALD

Figure 5C:
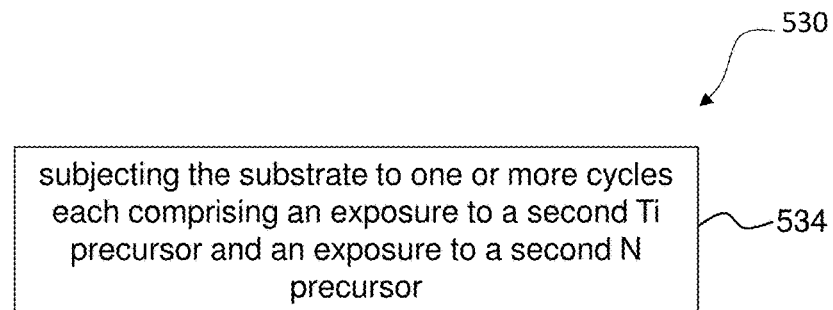
FIG. 5C schematically illustrates a flow chart of a method of forming a TiN layer by atomic layer deposition, according to embodiments.

Referring back to FIG. 5A, after providing 510 the substrate and forming 520 a seed layer or region comprising Si and N by thermal ALD, the method 500 continues to form 530 a TiN layer on the seed layer by thermal ALD. FIG. 5C illustrates forming 530 a TiN layer on the seed layer according some embodiments. In various embodiments, forming 530 the TiN layer comprises subjecting the substrate to one or more cycles each comprising one or more exposures of the substrate to a second Ti precursor and one or more exposures to a second N precursor. A cycle of forming 530 the TiN layer can be similar to a substep of forming 520 the seed layer including subjecting 528B the substrate to one or more second deposition phases as described above with respect to FIG. 5B, although in some embodiments different precursors may be used as further discussed below.

In various embodiments, forming 530 the TiN comprises subjecting 534 the substrate to one or more cycles, each comprising an exposure to a second Ti precursor and an exposure to a second N precursor. Each exposure to the second Ti precursor is such that the surface of the substrate is fully or partly saturated with the second Ti precursor. After exposing the substrate to the second Ti precursor, excess or residual second Ti precursor or its reaction products that do not remain adsorbed or chemisorbed on the surface of the substrate may be pumped or purged out. Similarly, each exposure to the second N precursor is such that the substrate is fully or partly saturated with the second N precursor. After exposing the substrate to the second N precursor, excess or residual second N precursor or its reaction products that do not remain adsorbed or chemisorbed on the surface of the substrate may be pumped or purged out.

In some embodiments, the exposure to the second Ti precursor and/or the exposure to the second N precursor may be performed a plurality of times. Advantageously, under some circumstances, exposing the substrate to the second Ti precursor and/or the second N precursor more than once may result in a higher level of surface saturation e.g., when substantial stearic hindrance effect exists.

Various parameters and additional details of forming 530 the TiN that are the same or similar to corresponding details as described above with respect to forming 520 the seed layer in FIG. 5B, e.g., subjecting 528B the substrate to one or more second deposition phases, and are omitted herein.

According to various embodiments, non-limiting examples of the second N precursor, which may be the same or different from the first N precursor described above with respect to the seed layer formation, include ammonia ($NH_3$), hydrazine ($N_2H_4$) or monomethylhydrazine ($CH_3(NH)NH_2$, "MMH").

According to various embodiments, non-limiting examples of the second Ti precursor, which may be the same or different from the first Ti precursor described above with respect to the seed layer formation, include titanium tetrachloride ($TiCl_4$), tetrakis(dimethylamino)titanium (TDMAT) or tetrakis(diethylamino)titanium (TDEAT).

Advantageously, when the TiN layer is formed on a seed layer according to various embodiments, one or both of the surface roughness and electrical resistivity can be reduced compared to the TiN layer formed without the seed layer, e.g., directly on a non-metal surface. For example, when formed as a diffusion barrier structure, the overall thickness of the stack including the seed layer and the TiN layer can have a combined stack thickness that does not exceed about 20 nm, 15 nm, 10 nm, 7 nm, 4 nm, 2 nm, or having a value in a range defined by any of these values. Of the overall stack thickness, the thickness of the seed layer or region can be about 5 nm, 4 nm, 3 nm, 2 nm, 1 nm, 0.5 nm, or have a value in a range defined by any of these values, and the remainder of the combined thickness can be attributed to the TiN layer. A ratio of the thicknesses of the TiN layer to the seed layer can exceed 5, 10, 20, 50, 100, 200, 400, or be a value in a range defined by any of these values.

As deposited, the seed layer having the above-indicated thicknesses can have a root-mean square (RMS) surface roughness of 0.5%, 1%, 1.5%, 2%, 2.5%, 3%, 3.5%, 4%, 4.5% and 5%, on the basis of an average thickness of the seed layer, and the stack including the seed layer and the TiN layer can have a RMS surface roughness of 3%, 4%, 5%, 6%, 7%, 8%, and 9%, on the basis of an average thickness of the stack. Alternatively, as-deposited, the seed layer having the above-indicated thicknesses can have a root-mean square (RMS) surface roughness value that is less than 0.5 nm, 0.4 nm, 0.3 nm, 0.2 nm, 0.1 nm, or a value in a range defined by any of these values. Alternatively, as-deposited, the stack including the seed layer and the TiN layer can have a RMS surface roughness value that is less than 2.5 nm, 2 nm, 1.5 nm, 1.0 nm, 0.5 nm, or a value in a range defined by any of these values. Relative to a TiN layer that is grown on the same non-metal surface without the seed layer, e.g., a dielectric or semiconductor surface, the surface roughness can be reduced by 10%, 20%, 30%, 40%, 50% or 60% on the basis of an average thickness of the TiN layer that is grown without the seed layer. By way of an experimental example, an as-grown seed layer on an $SiO_2$ surface can have an RMS roughness of about 1.1%, and as grown TiN layer on an $SiO_2$ surface without a seed layer can have a RMS roughness of about 8.4%, and an as-grown TiN layer on a seed layer formed on an $SiO_2$ surface can have an RMS roughness of about 5.8%, representing about 30% reduction in surface roughness by using a seed layer.

As deposited, the stack including the seed layer and the TiN layer can have an electrical resistivity of <70 µΩ-cm, 70-100 µΩ-cm, 100-130 µΩ-cm, 130-160 µΩ-cm, 160-190 µΩ-cm, 190-220 µΩ-cm, 220-250 µΩ-cm, 250-280 µΩ-cm, 280-310Ω-cm, or greater than 310 µΩ-cm, or a value in a range defined by any of these values, for instance less than about 200 µΩ-cm. Relative to a TiN layer that is grown on the same surface without the seed layer, e.g., a dielectric or semiconductor surface, these values can represent a reduction in the resistivity of the TiN layer by 10%, 20%, 30%, 40%, 50% or 60% on the basis of the resistivity of the TiN layer that is grown on the same surface without the seed layer. By way of an experimental example, an as grown TiN layer on a $SiO_2$ surface without a seed layer can have a resistivity of about 170 µΩ, and an as-grown TiN layer on a seed layer formed on a $SiO_2$ can have a resistivity of 100 µΩ, representing about 40% reduction in resistivity by using a seed layer.

Physical Characterization of Seed Layer/TiN Layer Stack

Figure 6:
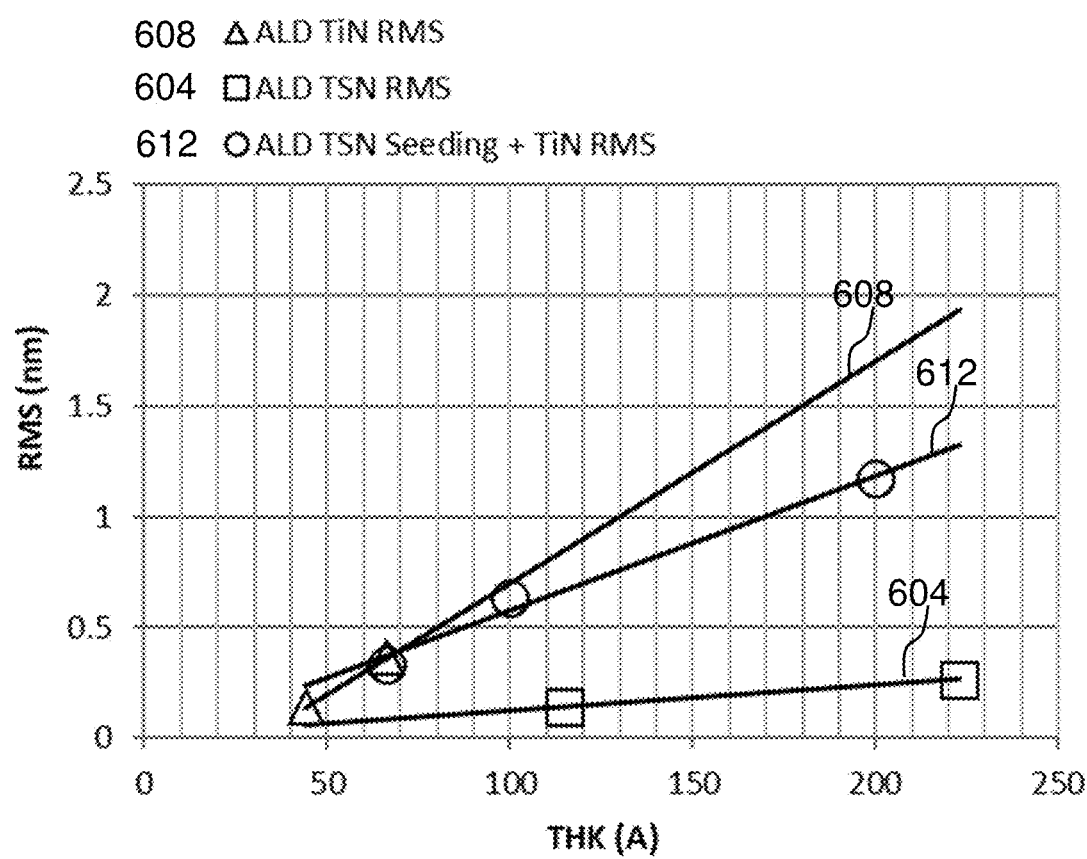
FIG. 6 is a graph showing experimentally measured surface roughness values of a TiSiN seed layer, a TiN layer and a stack including a TiN layer on a TiSiN seed layer, as a function of thickness.

FIG. 6 is a graph illustrating experimentally measured root mean square (RMS) surface roughness trends 604, 608 and 612 for TiSiN seed layers, TiN layers and TiSiN seed layer/TiN layer stacks, respectively, as a function of deposited thickness for the respective layers. Each experimental data is from a film grown on a native $SiO_2$-coated Si substrate. The surface roughness trends 604, 608 and 612 corresponding to the TiSiN seed layers, the TiN layers and the TiSiN seed layer/TiN layer stacks grown on an $SiO_2$ surface show root mean square (RMS) values of surface roughness that are less than about 1.1%, 8.4% and 5.8%, respectively, relative to the respective thicknesses. The measured RMS roughness values generally scale linearly with thickness up to at least about 22.5 nm for the different layers. As demonstrated by the surface roughness trends 604, 608 and 612, the presence of a TiSiN seed layer results in a substantially lower final surface roughness as measured on TiSiN seed layer/TiN layer stacks, in part due to the growth of at least the seed layer in a layer-by-layer growth mode, as described above.

Figure 7:
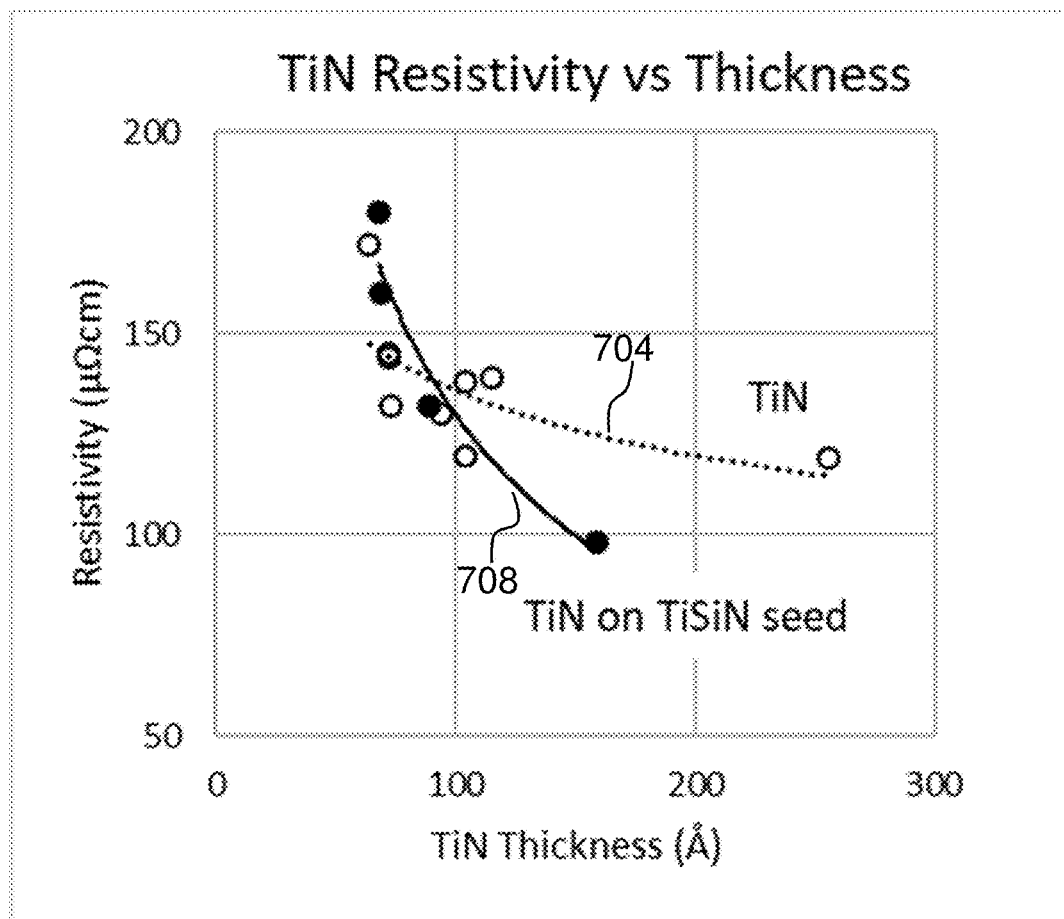
FIG. 7 is a graph showing experimentally measured electrical resistivity values of a TiN layer and a stack including a TiN layer on a TiSiN seed layer, as a function of thickness.

FIG. 7 is a graph illustrating experimentally measured resistivity trends 704 and 708 as a function of TiN layer or stack thickness for TiN layers and TiSiN seed layer/TiN layer stacks, respectively, each grown on a native $SiO_2$-coated Si substrate. For each of the data points for the resistivity trend 708, a TiSiN seed layer having a thickness of about 0.5 nm, corresponding to about 2 cycles of exposures to Si, N and Ti precursors, was grown by thermal ALD prior to forming the TiN layer by thermal ALD. For a thickness range of 7 nm to about 16 nm, the resistivity of TiN layers grown on TiSiN seed layers show resistivity values that are between about 20% higher and 20% lower relative to the resistivity values of corresponding TiN layers grown directly without a seed layer.

Applications

The seed layer/TiN layer stack according to various embodiments disclosed herein can be used in a variety of applications, particularly where the substrate comprises a relatively high aspect ratio structure and/or a non-metal surface that can benefit from various advantageous characteristics of the seed layer/TiN layer stack as disclosed herein. Example applications include deposition a via, a hole, a trench, a cavity or a similar structure having an aspect ratio, e.g., a ratio defined as a depth divided by a top width, that exceeds 1, 2, 5, 10, 20, 50, 100, 200 or a value in a range defined by any of these values.

Figure 8:
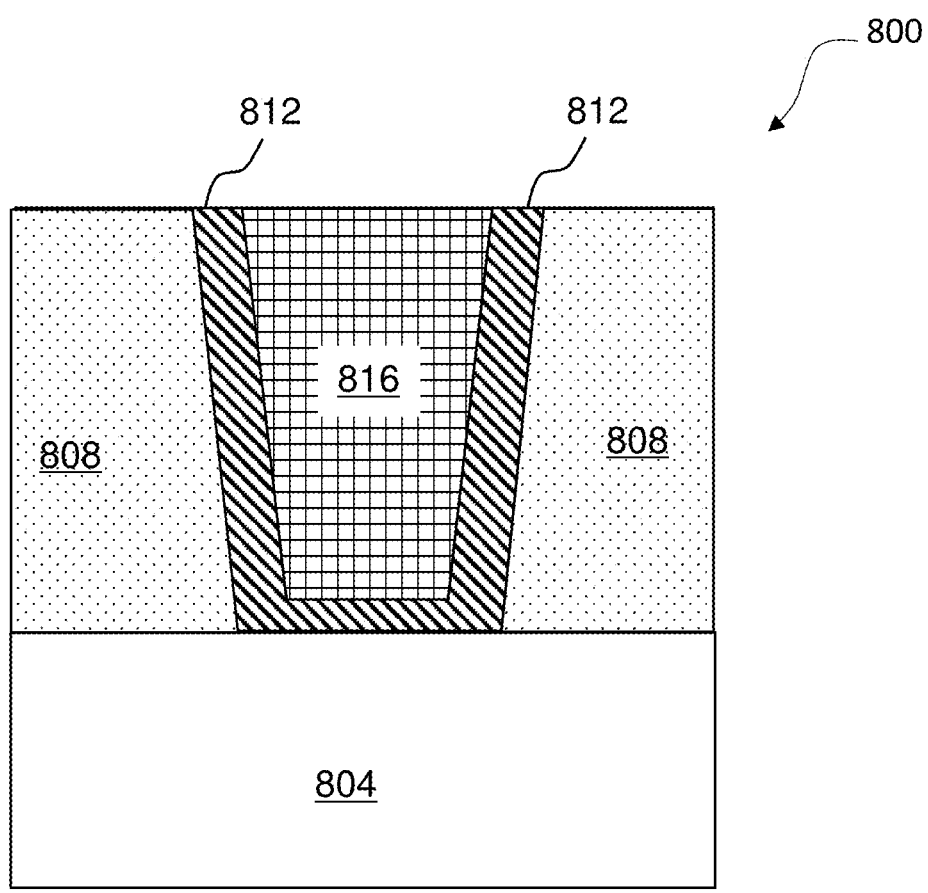
FIG. 8 schematically illustrates a cross-sectional view of a via lined with a TiN layer formed on a seed layer comprising Si and N, according to embodiments.

By way of example, FIG. 8 schematically illustrates an application in the context of a diffusion barrier for a contact structure, e.g., a source or drain contact, formed on an active semiconductor substrate region that may be heavily doped. A portion of a semiconductor device 800 is illustrated, which includes a substrate 804 on which a dielectric layer 808, e.g., an intermetal dielectric (ILD) layer comprising a dielectric material such as an oxide or nitride is formed. In order to form contacts to various regions of the substrate 804, including various doped regions, e.g., source and drain regions, a via or a trench may be formed through the dielectric layer 808. The via or the trench may expose various non-metal surfaces, e.g., an exposed bottom surface comprising a substrate surface, e.g., a silicon substrate surface, as well as dielectric sidewalls of the vias. The bottom and side surfaces of the via can be conformally coated with a barrier layer 812 formed according to various embodiments described herein. A conformal seed layer may first be formed to directly on inner surfaces of the via, followed by formation of a conformal TiN layer, according various embodiments disclosed herein. Thereafter, the lined via may be filled with a metal, e.g., W, Al or Cu, to form a contact plug 816. For example, the via may be filled with tungsten by CVD using, e.g., $WF_6$.

The barrier layer 812 formed according to embodiments can be advantageous for various reasons. In particular, due to the conformal nature of the barrier layer 812 formed by ALD, the propensity for a pinching off during the subsequent metal fill process may be substantially reduced. In addition, as described above, the barrier layer 812 can provide effective hindrance of material transport thereacross, e.g., dopant (B, P) out-diffusion from the substrate 804, as well as in-diffusion of reactants, etchants and metals (e.g., F, Cl, W or Cu) from the contact plug formation process. The barrier effect may be enhanced by reduced number of grain boundaries and/or at least partially amorphous seed layer. Furthermore, as described above, a layer-by-layer growth mode may reduce the overall contact resistance of the barrier layer 812. Furthermore, due to the reduced film roughness, a relatively thinner barrier layer 812 may be formed, leading to further reduction in contact resistance.

Other applications of the seed layer/TiN layer stacks according various embodiments disclosed herein include conductive structures formed in recessed substrates (e.g., buried electrodes or lines), electrodes (e.g., DRAM capacitor electrodes or gate electrodes), metallization barriers for higher metal levels (e.g., Cu barriers), high aspect ratio vertical rod electrodes or vias for three-dimensional memory and through-silicon vias (TSVs), to name a few.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of forming a thin film comprising titanium nitride (TiN), the method comprising:
   providing a semiconductor substrate comprising a non-metallic surface;

forming on the non-metallic surface a seed layer by atomic layer deposition (ALD), wherein the seed layer is a SiN seed layer; and forming on the seed layer a TiN layer by ALD, wherein forming the seed layer comprises alternatingly exposing the semiconductor substrate to one or more cycles, each of the cycles comprising an exposure to a Si precursor and an exposure to a N precursor, thereby forming the SiN seed layer, wherein the seed layer is distinct from the TiN layer and continuously covers the non-metallic surface with a thickness of about 0.5 nm to about 5 nm, and wherein a root mean square surface roughness of a stack comprising the TiN layer formed on the seed layer is less than about 8% of a thickness of the stack.

2. The method of claim 1, wherein a surface roughness of the stack is about the same or lower relative to a surface roughness of a reference TiN layer that is formed using the same ALD as that used to form the TiN layer, but directly formed on a reference non-metallic surface that is the same as the non-metallic surface without a seed layer formed thereon.

3. The method of claim 1, wherein forming the seed layer and the TiN layer comprises forming by thermal ALD.

4. The method of claim 1, wherein the non-metallic surface comprises one or both of a semiconductor surface and an insulator surface.

5. The method of claim 1, wherein forming one or both of the seed layer and the TiN layer on the seed layer comprise growing in a layer-by-layer growth mode.

6. The method of claim 1, wherein forming one or both of the seed layer and the TiN layer on the seed layer comprise exposing the semiconductor substrate to a Si precursor selected from the group consisting of $SiH_4$, $Si_2H_6$, $SiH_2Cl_2$, $SiH_3Cl$, $Si_2Cl_6$ and $Si_3Cl_8$.

7. The method of claim 1, wherein the seed layer is at least partially amorphous.

8. The method of claim 1, wherein the semiconductor substrate comprises a trench or a via comprising an inner surface comprising the non-metallic surface, and wherein forming the thin film comprises conformally lining the inner surface.

9. The method of claim 1, wherein an electrical resistivity of the TiN layer formed on the seed layer is about the same or lower relative to an electrical resistivity of a reference TiN layer that is formed using the same ALD as that used to form the TiN layer, but directly formed on a reference non-metallic surface that is the same as the non-metallic surface without a seed layer formed thereon.

10. A method of forming a thin film comprising titanium nitride (TiN), the method comprising:

providing a semiconductor substrate comprising a non-metallic surface;

forming on the non-metallic surface a seed layer by atomic layer deposition (ALD), wherein the seed layer is a SiN seed layer; and forming on the seed layer a TiN layer by ALD, wherein forming the seed layer comprises exposing the semiconductor substrate to a Si precursor as a first non-nitrogen precursor and further exposing the semiconductor substrate to a N precursor, thereby forming the SiN seed layer, wherein the seed layer is distinct from the TiN layer and continuously covers the non-metallic surface with a thickness of about 0.5 nm to about 5 nm, and wherein an electrical resistivity of a stack comprising the TiN layer formed on the seed layer is less than about 200 μΩ-cm.

11. The method of claim 10, wherein forming the seed layer and the TiN layer comprises forming by thermal ALD.

12. The method of claim 10, wherein the electrical resistivity of the stack is about the same or lower relative to a reference TiN layer that is formed using the same ALD as that used to form the TiN layer, but directly formed on a reference non-metallic surface that is the same as the non-metallic surface without a seed layer formed thereon.

13. The method of claim 10, wherein a ratio of thicknesses of the seed layer and the TiN layer is such that the TiN layer has an electrical resistivity less than about 200 μΩ-cm.

14. The method of claim 10, wherein a thickness ratio between the TiN layer formed on the seed layer and the seed layer exceeds 5.

15. The method of claim 10, wherein a surface roughness of the TiN layer formed on the seed layer is about the same or lower relative to a surface roughness of a reference TiN layer that is formed using the same ALD as that used to form the TiN layer, but directly formed on a reference the non-metallic surface that is the same as the non-metallic surface without a seed layer formed thereon.

\* \* \* \* \*